US010570505B2

(12) United States Patent
Nagatsu et al.

(10) Patent No.: US 10,570,505 B2
(45) Date of Patent: Feb. 25, 2020

(54) TANTALUM SPUTTERING TARGET, AND PRODUCTION METHOD THEREFOR

(71) Applicant: JX Nippon Mining & Metals Corporation, Tokyo (JP)

(72) Inventors: Kotaro Nagatsu, Ibaraki (JP); Shinichiro Senda, Ibaraki (JP)

(73) Assignee: JX Nippon Mining & Materials Corporation, Tokyo (JP)

( * ) Notice: Subject to any disclaimer, the term of this patent is extended or adjusted under 35 U.S.C. 154(b) by 99 days.

(21) Appl. No.: 15/571,562

(22) PCT Filed: May 17, 2016

(86) PCT No.: PCT/JP2016/064537
§ 371 (c)(1),
(2) Date: Nov. 3, 2017

(87) PCT Pub. No.: WO2016/190159
PCT Pub. Date: Dec. 1, 2016

(65) Prior Publication Data
US 2018/0105926 A1   Apr. 19, 2018

(30) Foreign Application Priority Data

May 22, 2015 (JP) .................... 2015-104295

(51) Int. Cl.
*C23C 14/34* (2006.01)
*C22F 1/18* (2006.01)
*B21J 1/02* (2006.01)

(52) U.S. Cl.
CPC .......... *C23C 14/3414* (2013.01); *B21J 1/02* (2013.01); *C22F 1/18* (2013.01)

(58) Field of Classification Search
CPC .................................... C23C 14/3414
See application file for complete search history.

(56) References Cited

U.S. PATENT DOCUMENTS

| | | |
|---|---|---|
| 6,331,233 B1 | 12/2001 | Turner |
| 6,348,113 B1 | 2/2002 | Michaluk et al. |
| 6,348,139 B1 | 2/2002 | Shah et al. |
| 6,676,728 B2 | 1/2004 | Han et al. |
| 7,081,148 B2 | 7/2006 | Koenigsmann et al. |

(Continued)

FOREIGN PATENT DOCUMENTS

| | | |
|---|---|---|
| EP | 0902102 A1 | 3/1999 |
| JP | 2001-295035 A | 10/2001 |

(Continued)

*Primary Examiner* — John J Brayton
(74) *Attorney, Agent, or Firm* — Howson & Howson LLP

(57) ABSTRACT

Provided is a tantalum sputtering target, which includes an area ratio of crystal grains of which a {111} plane is oriented in a direction normal to a rolling surface (ND) is 35% or more when the ND, which is a cross section orthogonal to a sputtering surface of a target, is observed via Electron Backscatter Diffraction Pattern method. The object of the present invention is to provide a tantalum sputtering target in which a sputtered material can be uniformly deposited on a wafer surface under high-power sputtering conditions by increasing the straightness of the sputtered material. By using this kind of tantalum target for sputter-deposition, it is possible to improve the film thickness uniformity and the throughput of deposition even for fine wiring.

7 Claims, 3 Drawing Sheets

(56) References Cited

U.S. PATENT DOCUMENTS

| | | |
|---|---|---|
| 7,101,447 B2 | 9/2006 | Turner |
| 7,156,963 B2 | 1/2007 | Oda |
| 7,699,948 B2 | 4/2010 | Oda |
| 7,716,806 B2 | 5/2010 | Oda |
| 7,740,717 B2 | 6/2010 | Oda |
| 7,892,367 B2 | 2/2011 | Oda |
| 7,998,287 B2 | 8/2011 | Wickersham, Jr. et al. |
| 8,172,960 B2 | 5/2012 | Oda et al. |
| 8,177,947 B2 | 5/2012 | Miyashita |
| 8,231,745 B2 | 7/2012 | Wickersham, Jr. et al. |
| 8,250,895 B2 | 8/2012 | Bozkaya et al. |
| 8,252,126 B2 | 8/2012 | Matera et al. |
| 8,425,696 B2 | 4/2013 | Oda et al. |
| 8,747,633 B2 | 6/2014 | Nakashima et al. |
| 9,085,819 B2 | 7/2015 | Senda et al. |
| 9,095,885 B2 | 8/2015 | Jepson et al. |
| 9,150,957 B2 | 10/2015 | Holcomb et al. |
| 2002/0112789 A1 | 8/2002 | Jepson et al. |
| 2011/0266145 A1 | 11/2011 | Fukushima et al. |
| 2012/0031756 A1 | 2/2012 | Fukushima et al. |
| 2012/0037501 A1 | 2/2012 | Fukushima et al. |
| 2012/0061672 A1 | 3/2012 | O'Rourke et al. |
| 2012/0132523 A1 | 5/2012 | Hagihara et al. |
| 2012/0267236 A1 | 10/2012 | Nakashima et al. |
| 2013/0092534 A1 | 4/2013 | Senda et al. |
| 2013/0098759 A1 | 4/2013 | Senda et al. |
| 2014/0242401 A1 | 8/2014 | Senda et al. |
| 2015/0064056 A1 | 3/2015 | Nagatsu et al. |
| 2015/0279637 A1 | 10/2015 | Senda et al. |
| 2015/0329959 A1 | 11/2015 | Senda et al. |
| 2015/0348765 A1 | 12/2015 | Senda et al. |
| 2016/0208377 A1 | 7/2016 | Oda |
| 2016/0217983 A1 | 7/2016 | Oda |
| 2017/0372879 A1 | 12/2017 | Nagatsu et al. |

FOREIGN PATENT DOCUMENTS

| | | |
|---|---|---|
| JP | 2002-363736 A | 12/2002 |
| WO | 2009/107763 A1 | 9/2009 |

Positions where Structure was Observed ●

TANTALUM SPUTTERING TARGET, AND PRODUCTION METHOD THEREFOR

BACKGROUND

Technical Field

The present invention relates to a tantalum sputtering target suitable for forming a barrier seed layer in a wiring of a semiconductor integrated circuit, and particularly the tantalum sputtering target that are capable of achieving thickness uniformity even under high-power sputtering conditions by increasing the straightness of the sputtered material and a method for producing the tantalum sputtering target.

Background

The sputtering method for forming films from metals, ceramics and other materials has been used in numerous fields such as electronics, corrosion resistant materials and ornaments, catalysts, as well as in the manufacture of cutting/polishing materials and abrasion resistant materials. While the sputtering method itself is a well-known method in the foregoing fields, a tantalum sputtering target suitable for forming films of complex shapes or forming circuits are more in demand especially in the electronics field.

Generally speaking, this tantalum target is manufactured by performing forging and annealing (i.e. heat treatment) to an ingot or a billet obtained by subjecting a tantalum raw material to electron beam melting and casting, and thereafter performing rolling and finish processing such as machining and polishing to the ingot or billet to obtain a target. In this kind of production process, the forging and recrystallization annealing to the ingot or billet obtained via melting/casting will destroy the cast structure, and uniform and fine crystal grains are consequently obtained.

When performing sputtering, as the crystal grains of the target are finer and more uniform, more uniform deposition is enabled and a film with stable characteristics can be obtained. It is also effective to align the crystal orientation across the entire thickness direction of the target to improve the uniformity of deposition. Note that the following background art are known in relation to a tantalum sputtering target (Patent Documents 1 to 11).

High-power sputtering using a magnetron sputtering device is being performed to increase the deposition rate of sputtering in recent years. With high-power sputtering, it is difficult to control the direction of the material sputtered from the target and to uniformly deposit a sputtered material on the wafer surface in a wiring of semiconductor integrated circuits which is constantly being refined. The issues are especially notable when embedding wiring holes having a large aspect ratio.

PRIOR ART DOCUMENTS

Patent Documents

Patent Document 1: Japanese Patent Application Publication No. 2004-107758
Patent Document 2: WO2006/117949
Patent Document 3: Japanese Patent Application Publication No. H11-80942
Patent Document 4: Japanese Patent Application Publication No. 2004-162117
Patent Document 5: WO2004/090193
Patent Document 6: WO2005/045090
Patent Document 7: Japanese Patent Application Laid-Open Publication (Translation of PCT Application) No. 2008-532765
Patent Document 8: Japanese Patent Application Laid-Open Publication (Translation of PCT Application) No. 2007-536431
Patent Document 9: Japanese Patent Application Laid-Open Publication (Translation of PCT Application) No. 2002-530534
Patent Document 10: Japanese Patent Application Publication No. 2002-363736
Patent Document 11: Japanese Patent Application Publication No. 2001-295035

SUMMARY OF THE INVENTION

Problems to be Solved by the Invention

An object of the present invention is to provide a tantalum sputtering target in which high-speed and uniform deposition is enabled under high-power sputtering conditions. When sputter-deposition is performed using this kind of tantalum target, it is possible to form a thin film having superior film thickness uniformity and improve the productivity of the thin film formation process, even for fine wiring.

Means for Solving the Problems

In order to achieve the foregoing object, the present inventors conducted research and found out that, when the structural orientation of a tantalum sputtering target is caused to be a predetermined state by devising the rolling method, the straightness of the sputtered material can be improved, the sputtered material can be uniformly deposited on the wafer surface, and even fine wiring holes having a high aspect ratio can be embedded effectively, and the throughput of deposition can be improved.

Based on the foregoing discovery, embodiments of the present invention provide a tantalum sputtering target, wherein, when observation is made of orientations of crystal grains constituting the target in relation to a direction normal, ND, to a sputtering surface of the target along a cross section orthogonal to the sputtering surface of the target by using an electron backscatter diffraction pattern method, a total area of areas of the crystal grains having an orientation such that a {111} plane is oriented in the ND direction has an area ratio of 35% or more to an area of the cross section in which the observation is made. In addition, when observation is made of orientations of crystal grains constituting the target in relation to a direction normal, ND, to a sputtering surface of the target along a cross section orthogonal to the sputtering surface of the target by using an electron backscatter diffraction pattern method and when an area ratio of the crystal grains for {hkl} plane is defined as a ratio of a total area of areas of the crystal grains having an orientation such that the {hkl} plane thereof is oriented in [a] the ND direction to an area of the cross section in which the observation is made and is written as $A_{\{hkl\}}$, $A_{\{111\}}/A_{\{100\}}$ is 2.0 or more, where $A_{\{111\}}$ and $A_{\{100\}}$ represent area ratios of the crystal grains for {111} plane and {100} plane, respectively.

Effect of the Invention

According to embodiments of the present invention, since the straightness of the sputtered material can be increased and the sputtered material can be uniformly deposited on the wafer surface even under high-power sputtering conditions by causing the structural orientation of a tantalum sputtering target to be a predetermined state, the film thickness uniformity and the throughput of deposition can be simultaneously improved even for fine wiring. Embodiments of the present invention provide a tantalum sputtering target that enables uniform deposition on wiring holes having a large aspect ratio.

DESCRIPTION OF THE EMBODIMENTS

Figure 1:
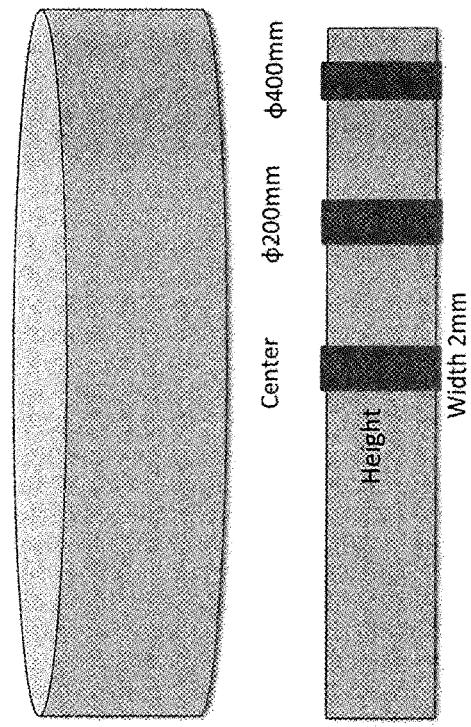
FIG. 1 is a diagram illustrating the positions where the structure of the sputtering target was observed.
Figure 1:
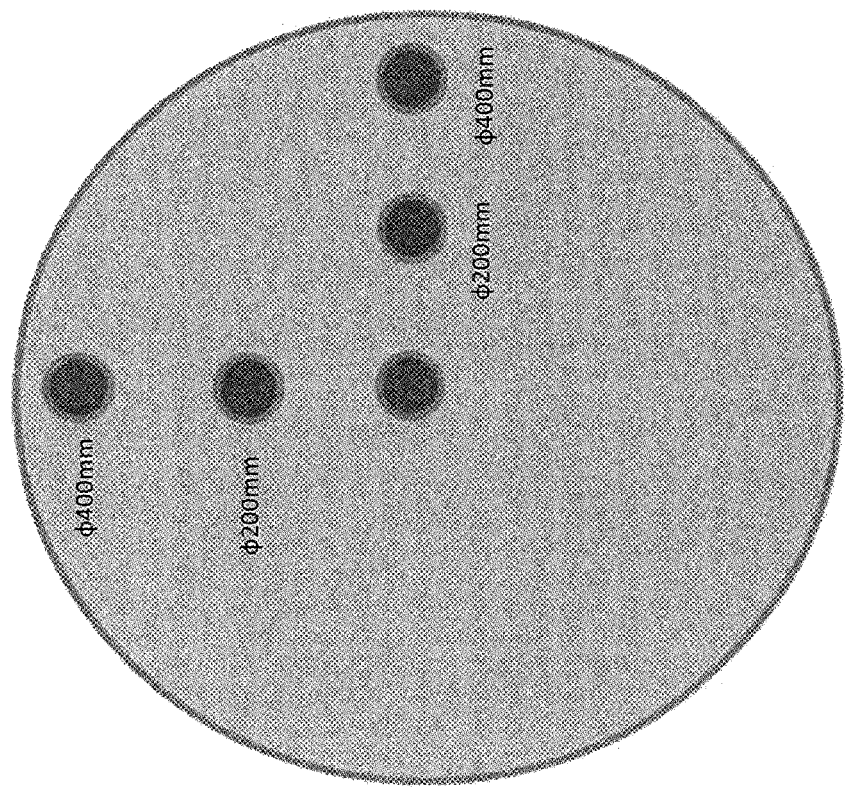

The sputtering target according to the embodiments of the present invention is characterized in that observation is made of orientations of crystal grains constituting the target in relation to a direction normal, ND, to a sputtering surface of the target along a cross section orthogonal to the sputtering surface of the target by using an Electron Backscatter Diffraction Pattern (abbreviated EBSP(s) hereinafter) method, a total area of areas of the crystal grains having an orientation such that a {111} plane is oriented in the ND direction has an area ratio of 35% or more to an area of the cross section in which the observation is made. With regard to the area ratio, an EBSP device (JSM-7001 FTTLS-type field emission electron microscope/crystal orientation analyzing device OIM6.0-CCD/BS) is used to observe five positions shown in FIG. 1 (left) and obtain an average area ratio of crystal grains of which the {111} plane is oriented in the ND with regard to the structure of the cross section (width: 2 mm, height: 6.35 mm) orthogonal to the sputtering surface as shown in FIG. 1 (right).

With tantalum having a body-centered cubic structure, the atomic close-packed direction is <111>, and the relation of the sputtering surface and the close-packed direction is important in controlling the sputter direction of the sputtered material. When the {111} plane is oriented in the direction normal to the rolling surface (ND), since the close-packed direction coincides with the direction normal to the sputtering surface, the straightness of the sputtered material can be increased. Note that the crystal grains of which the {111} plane is oriented in the ND include the crystal grains of which the orientation deviation of the {111} plane relative to the direction normal to the rolling surface (ND) is within 15°. While there is no particular limit in the upper limit value of the area ratio of the crystal grains having the {111} plane, in effect it is difficult to achieve an area ratio of 60% or higher.

According to the embodiment of the present invention, when observation is made of orientations of crystal grains constituting the target in relation to a direction normal, ND, to a sputtering surface of the target along a cross section orthogonal to the sputtering surface of the target by using an electron backscatter diffraction pattern method and when an area ratio of the crystal grains for {hkl} plane is defined as a ratio of a total area of areas of the crystal grains having an orientation such that the {hkl} plane thereof is oriented in the ND direction to an area of the cross section in which the observation is made and is written as $A_{\{hkl\}}$, $A_{\{111\}}/A_{\{100\}}$ is preferably 2.0 or more, where $A_{\{111\}}$ and $A_{\{100\}}$ represent area ratios of the crystal grains for {111} plane and {100} plane, respectively. When the {100} plane is oriented in the direction normal to the rolling surface (ND), since the angle of the close-packed direction relative to the direction normal to the sputtering surface will become large (wide), the straightness of sputter-deposition can be further improved by lowering the ratio of this plane. As the ratio of $A_{\{111\}}/A_{\{100\}}$ is greater, the deposition rate can be increased. Further, deposition with film thickness uniformity is also consequently enabled for some reason. Note that the crystal grains of which the {100} plane is oriented in the ND include the crystal grains of which the orientation deviation of the {100} plane relative to the direction normal to the rolling surface (ND) is within 15°. Furthermore, the area ratio of the crystal grains having the {100} plane is obtained in the same manner as the area ratio of the crystal grains having the {111} plane described above.

According to the embodiment of the present invention, a tantalum target having a purity of 99.99% or higher is preferably used. Since impurities in the target may cause the device characteristics in a semiconductor integrated circuit to deteriorate, a tantalum target having the highest purity is preferably used. In the present invention, the purity of 99.99% (4N) means that the total amount of Na, Al, Si, K, Ti, Cr, Mn, Fe, Co, Ni, Cu, Zn, and Zr is less than 100 ppm when a Ta ingot is analyzed via glow discharge mass spectrometry (GDMS).

The method of producing the tantalum sputtering target of the present invention is as follows.

Foremost, tantalum is melted and cast to prepare an ingot, and the prepared ingot is thereafter forged. The ingot is subject to press forging to prepare a billet, and the billet is cut into an appropriate size and then subject to heat treatment. Furthermore, the billet is subject to first forging, first heat treatment, and second forging, divided into two, and then subject to second heat treatment, preferably at the temperature from 950 to 1100° C. The embodiments of the present invention are not particularly limited to the foregoing processes, and the number of times that forging is performed and the temperature of the heat treatment may be suitably selected upon performing the processes in order to adjust the forged structure.

Next, 1) the obtained material is rolled consecutively two or more times in one direction, and 2) rotated 90 degrees and then additionally rolled consecutively two or more times. These processes are repeated (1→2→1→2→ . . . ) in two sets or more to subsequently obtain a predetermined plate thickness. The foregoing rolling processes are adjusted so that the structural orientation is controlled at a rolling reduction of 12% or more and the total rolling reduction is 85% or higher. The number of rolling passes contributes considerably to controlling the orientation and the {100} orientation ratio can be increased when the number of passes is greater. Meanwhile, since the rolling workload will increase when the number of passes is greater, it is important to appropriately adjust the conditions regarding the number of passes. While heat treatment may also be performed during the rolling process, it is recommended to perform the heat treatment after the final rolling as will be explained below, rather than during the rolling process. The condition of heat treatment is at 750 to 1000° C. and preferably for 4 hours or longer.

Next, the rolled material is subject to heat treatment preferably at 750 to 1000° C. for 1 hour or longer, and thereafter machined into an intended shape to obtain a target. It is thereby possible to effectively destroy the forged structure and obtain a uniform and fine structure based on the rolling process. With regard to the texture of the present invention formed via the rolling process and heat treatment, the intended structural orientation can be obtained by comprehending which plane is preferentially oriented based on the EBSP method, and feeding back the results to the rolling process and heat treatment conditions.

EXAMPLES

Now the embodiment of the present invention is explained in detail with reference to the examples. These examples are merely illustrative, and the present invention shall in no way be limited thereby. In other words, the embodiment of the present invention covers the other modes and modifications included in the technical concept of this invention.

The evaluation method adopted in the Examples and Comparative Examples is as follows.

(Film Thickness Uniformity and Rate of Variability Thereof)

The film thickness uniformity and the rate of variability thereof are evaluated using the "average value" and the "standard deviation" of the rate of variability of the film thickness (standard deviation/average value×100) of each target life (i.e. each wafer). The target life can be represented as the integration of the power during sputtering and the total sputtering time. For example, when sputtering is performed at a power of 15 kW for 100 hours, the target life will be 1500 kWh.

Figure 2:
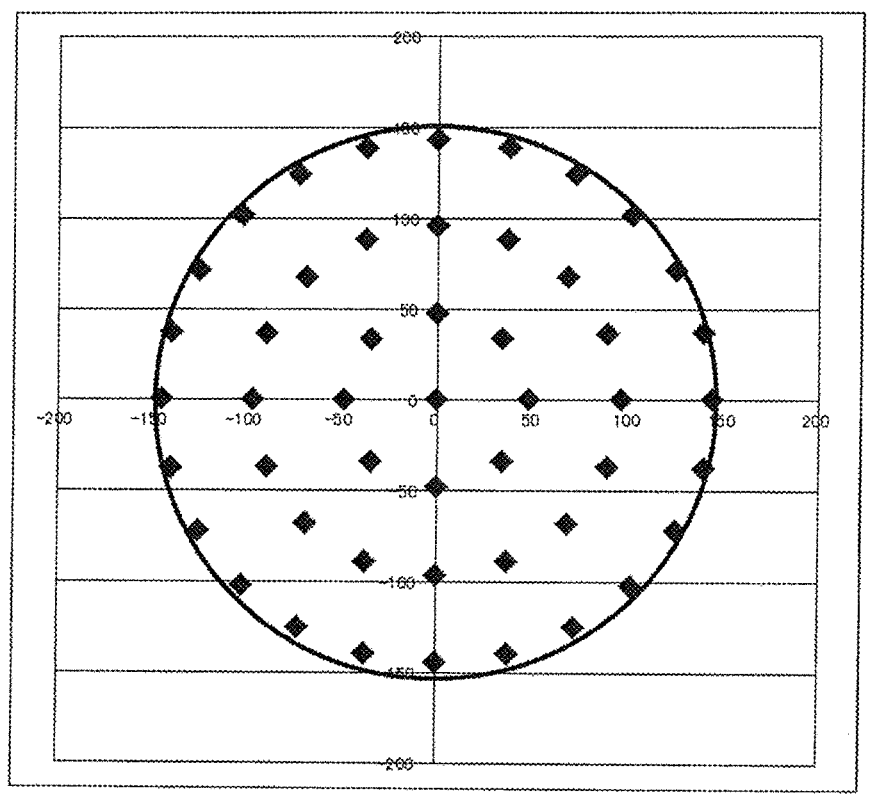
FIG. 2 is a diagram illustrating the positions where the sheet resistance of the film formed on the wafer was measured.

As a specific evaluation method, foremost, sputtering is performed for every 300 kWh (power of 300 kW for 1 hour), and a total of 7 wafers are deposited. Subsequently, the in-plane sheet resistance at 49 locations of each wafer is measured as shown in FIG. 2, the obtained values are converted into a film thickness (resistance value of tantalum is deemed 180 μΩcm), and the standard deviation and the average value of the film thickness are thereby obtained. Subsequently, the in-plane rate of variability of film thickness (%) of each wafer=standard deviation/average value× 100 is calculated, and the average value of "rate of variability of film thickness" calculated for each wafer is used as the film thickness uniformity. As the "rate of variability" of the film thickness uniformity, standard deviation/average value (corresponding to film thickness uniformity)×100 among wafers (relative to the target life) is calculated utilizing the "rate of variability of film thickness" of each wafer obtained above.

Example 1

A tantalum raw material having a purity of 99.997% was subject to electron beam melting and cast to prepare an ingot having a length of 1000 mm and a diameter of 195 mmφ. The ingot was subject to cold press forging to obtain a diameter of 150 mmφ, and thereafter cut to a required length to obtain a billet. Next, the billet was subject to heat treatment at a temperature of 1250° C., once again subject to cold first forging, subject to heat treatment at 1000° C., then subject to cold second forging, divided into two, and once again subject to heat treatment at 1000° C.

Subsequently, the forged billet was subject to cold rolling. The rolling process was performed by repeating continuous rolling passes at a rolling reduction of 12% or more a total of 10 times, and thereafter performing a rolling pass at a rolling reduction of less than 12%. After the rolling process, the rolled material was subject to heat treatment at 800° C. Next, finish machining was performed to the obtained target material having a thickness of 10 mm and a diameter of 500 mmφ to prepare a tantalum sputtering target having a thickness of 6.35 mm and a diameter of 450 mmφ.

Figure 3:
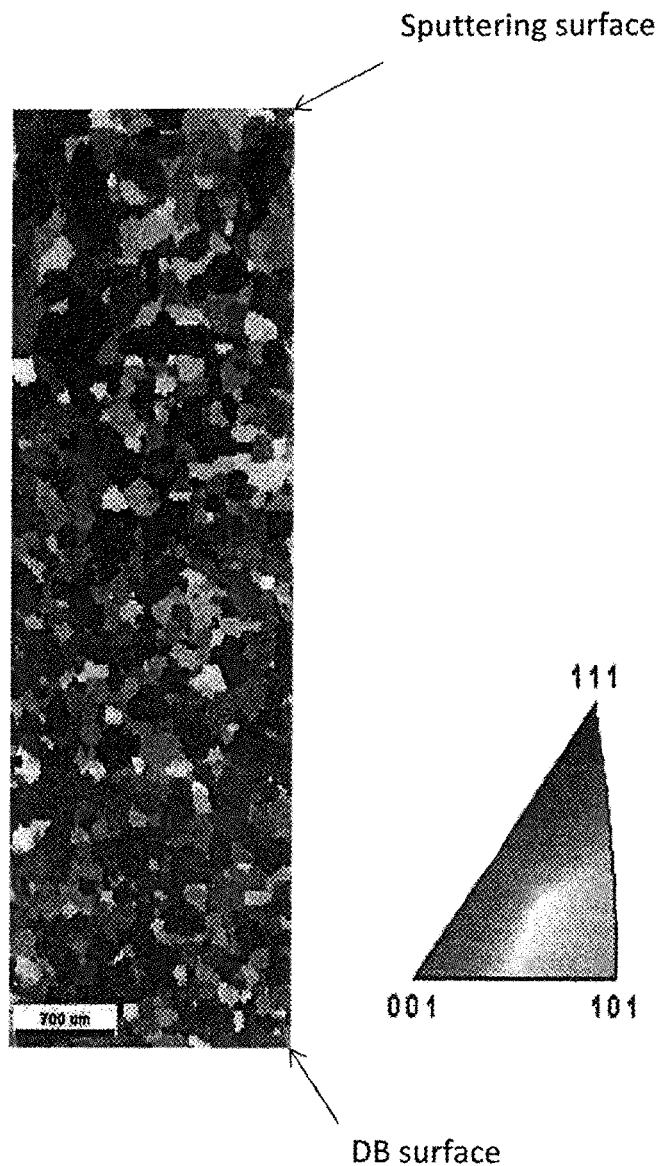
FIG. 3 shows images of the crystal orientation distribution of the target of Example 1 observed via EBSPs.

The surface of the tantalum sputtering target obtained based on the foregoing processes was polished with an abrasive paper (corresponds to #2000), additionally buffed with a Polipla solution and subject to mirror finishing, and thereafter treated with a mixed liquid of hydrofluoric acid, nitric acid, and hydrochloric acid. An EBSP device (JSM-7001 FTTLS-type field emission electron microscope/crystal orientation analyzing device OIM6.0-CCD/BS) was used to observe five positions of the obtained polished surface with regard to the structure of the cross section (width: 2 mm, height: 6.35 mm) orthogonal to the sputtering surface as shown in FIG. 1. Moreover, FIG. 3 shows the crystal orientation distribution. Consequently, the area ratio of the crystal grains having the {111} plane was 50.5%. The area ratio of the crystal grains of which the {100} plane is oriented in the ND was 7.5%. And the ratio {111}/{100} of the foregoing area ratios was 6.73. As a result of sputtering this target, the film thickness uniformity was 2.2 and the rate of variability of the film thickness uniformity was 0.15, both of which showed effectiveness. And, the deposition rate was 6.9 Å/second, which was the intended sputter rate. The results are shown in Table 1.

Examples 2-5

A forged billet was prepared in the same manner as Example 1. Next, the forged billet was subject to cold rolling. The rolling process was performed by adjusting the number of sets of continuous rolling passes at a rolling reduction of 12% or more as shown in Table 1, and thereafter performing a rolling pass at a rolling reduction of 6% or more so that the total rolling reduction will be 85% or more. After the rolling process, the rolled material was subject to heat treatment at 800° C. Next, finish machining was performed to the obtained target material having a thickness of 10 mm and a diameter of 500 mmφ to prepare a tantalum sputtering target having a thickness of 6.35 mm and a diameter of 450 mmφ.

With regard to the sputtering target obtained based on the foregoing processes, the structure of the cross section orthogonal to the sputtering surface of the target was observed in the same manner as Example 1. Consequently, the area ratio of the crystal grains of which the {111} plane is oriented in the ND was 35% or more in all cases. And the ratio {111}/{100} of the foregoing area ratios was 2.0 or more in all cases. As a result of sputtering this target, the film thickness uniformity and the rate of variability of the film thickness uniformity in all cases showed effectiveness. And the deposition rate was the intended sputter rate. The results are similarly shown in Table 1.

Comparative Examples 1-5

A forged billet was prepared in the same manner as Example 1. Next, the forged billet was subject to cold rolling. The rolling process was performed by adjusting the number of sets of continuous rolling passes at a rolling reduction of 12% or more as shown in Table 1, and thereafter performing a rolling pass at a rolling reduction of 6% or more so that the total rolling reduction will be 85% or more. After the rolling process, the rolled material was subject to heat treatment at 800° C. Next, finish machining was performed to the obtained target material having a thickness of 10 mm and a diameter of 350 mmφ to prepare a tantalum sputtering target having a thickness of 6.35 mm and a diameter of 320 mmφ.

With regard to the sputtering target obtained based on the foregoing processes, the structure of the cross section orthogonal to the sputtering surface of the target was observed in the same manner as Example 1. As a result, the area ratio of the crystal grains of which the {111} plane is oriented in the ND was less than 35% in all cases. And the ratio {111}/{100} of the foregoing area ratios was less than 2.0 in all cases. As a result of sputtering this target, the film thickness uniformity and/or the rate of variability of the film thickness uniformity deteriorated in all cases. Moreover, the sputter rate was high. The results are similarly shown in Table 1.

TABLE 1

| | Number of continuous roll passes of 12% or more | (111) area ratio | (100) area ratio | (111)/(100) | Film thickness uniformity | Deposition rate: (Å/second) | Evaluation |
|---|---|---|---|---|---|---|---|
| Example 1 | 10 | 50.5 | 7.5 | 6.73 | 2.2 | 6.9 | ◉ |
| Example 2 | 9 | 48.5 | 8.6 | 5.64 | 2.3 | 6.7 | ◉ |
| Example 3 | 8 | 44.1 | 12.9 | 3.42 | 2.4 | 6.4 | ○ |
| Example 4 | 7 | 36.9 | 13.6 | 2.71 | 2.4 | 6.5 | ○ |
| Example 5 | 6 | 36.7 | 18.3 | 2.01 | 2.6 | 6.4 | ○ |
| Comparative Example 1 | 5 | 34.9 | 23.1 | 1.51 | 2.7 | 6.2 | Δ |
| Comparative Example 2 | 4 | 32.4 | 27.7 | 1.17 | 2.7 | 6.2 | Δ |
| Comparative Example 3 | 3 | 30.8 | 22.7 | 1.36 | 2.8 | 6.1 | x |
| Comparative Example 4 | 2 | 27.2 | 27.4 | 0.99 | 2.7 | 6.3 | Δ |
| Comparative Example 5 | 1 | 24.3 | 29.5 | 0.82 | 2.9 | 6 | x |

Criteria

◉ → Deposition rate: 6.6 or more
  Film thickness uniformity: Less than 2.4
○ → Deposition rate: 6.4 to less than 6.6
  Film thickness uniformity: 2.4 to less than 2.6
Δ → Deposition rate: 6.2 to less than 6.4
  Film thickness uniformity: 2.6 to less than 2.8
x → Deposition rate: Less than 6.2
  Film thickness uniformity: 2.8 to less than 3.0

According to the embodiment of the present invention, by causing the structural orientation of a tantalum sputtering target to be a predetermined state, the straightness of the sputtered material can be increased and the sputtered material can be uniformly deposited on the wafer surface even under high-power sputtering conditions. The increase in the straightness of the sputtered material can eventually achieve both uniform film thickness and the throughput of deposition. Embodiments of the present invention provide a tantalum sputtering target that is useful in forming a thin film of an element wiring of a semiconductor integrated circuit.

The invention claimed is:

1. A tantalum sputtering target comprising, wherein orientations of crystal grains constituting the tantalum sputtering target in relation to a direction normal, ND, to a sputtering surface of the tantalum sputtering target observed via an electron backscatter diffraction pattern method along a cross section of the tantalum sputtering target orthogonal to the sputtering surface of the tantalum sputtering target are such that:
 a total area of areas of the crystal grains having an orientation such that a {111} plane thereof is oriented in the ND direction observed in the cross section of the tantalum sputtering target has an area ratio of 35% or more relative to a total area of the cross section of the tantalum sputtering target observed; and
 $A_{\{111\}}/A_{\{100\}}$ is 2.0 or more, where $A_{\{111\}}$ represents an area ratio of the total area of areas of crystal grains having a {111} plane oriented in the ND direction observed in the cross section of the tantalum sputtering target relative to the total area of the cross section of the tantalum sputtering target observed and $A_{\{100\}}$ represents an area ratio of a total area of areas of crystal grains having a {100} plane oriented in the ND direction observed in the cross section of the tantalum sputtering target relative to a total area of the cross section of the tantalum sputtering target observed.

2. The tantalum sputtering target according to claim 1, wherein $A_{\{111\}}$ is 36.7% to 50.5%.

3. The tantalum sputtering target according to claim 2, wherein $A_{\{100\}}$ is 7.5% to 18.3%.

4. The tantalum sputtering target according to claim 1, wherein $A_{\{111\}}/A_{\{100\}}$ is 2.01 to 6.73.

5. The tantalum sputtering target according to claim 1, wherein $A_{\{111\}}$ is 48.5% to 50.5%.

6. The tantalum sputtering target according to claim 5, wherein $A_{\{100\}}$ is 7.5% to 8.6%.

7. The tantalum sputtering target according to claim 1, wherein $A_{\{111\}}/A_{\{100\}}$ is 5.64 to 6.73.

\* \* \* \* \*